United States Patent [19]

Aronowitz et al.

[11] Patent Number: 5,585,286
[45] Date of Patent: Dec. 17, 1996

[54] IMPLANTATION OF A SEMICONDUCTOR SUBSTRATE WITH CONTROLLED AMOUNT OF NOBLE GAS IONS TO REDUCE CHANNELING AND/OR DIFFUSION OF A BORON DOPANT SUBSEQUENTLY IMPLANTED INTO THE SUBSTRATE TO FORM P- LDD REGION OF A PMOS DEVICE

[75] Inventors: Sheldon Aronowitz; James Kimball, both of San Jose; Yu-Lam Ho, Cupertino; Gobi Padmanabhan, Sunnyvale, all of Calif.; Douglas T. Grider, McKinney, Tex.; Chi-Yi Kao, San Jose, Calif.

[73] Assignee: LSI Logic Corporation, Milpitas, Calif.

[21] Appl. No.: 521,795

[22] Filed: Aug. 31, 1995

[51] Int. Cl.$^6$ .................................................. H01L 21/265
[52] U.S. Cl. .................................................. 437/24; 437/44
[58] Field of Search ........................ 437/44, 24, 41 RLD, 437/933, 57, 959; 148/DIG. 82, DIG. 83

[56] References Cited

U.S. PATENT DOCUMENTS

| 4,683,645 | 8/1987 | Naguib et al. | 437/41 |
| 4,689,667 | 8/1987 | Aronowitz | 357/63 |
| 4,837,173 | 6/1989 | Alvis et al. | 437/24 |
| 5,108,935 | 4/1992 | Rodder | 437/24 |
| 5,168,072 | 12/1992 | Moslehi | 437/44 |
| 5,215,934 | 6/1993 | Tzeng | 437/43 |
| 5,223,445 | 6/1993 | Fuse | 437/24 |
| 5,266,510 | 11/1993 | Lee | 437/24 |
| 5,298,435 | 3/1994 | Aronowitz et al. | 437/24 |
| 5,398,676 | 2/1995 | Antum et al. | 437/24 |
| 5,441,900 | 8/1995 | Bulucca et al. | 437/24 |
| 5,444,024 | 8/1995 | Antum et al. | 437/24 |
| 5,468,974 | 11/1995 | Aronowitz et al. | 259/51 |
| 5,508,211 | 4/1996 | Yee et al. | 437/24 |

FOREIGN PATENT DOCUMENTS

| 622834A2 | 4/1993 | European Pat. Off. | 437/24 |
| 60-254673 | 12/1985 | Japan | 437/24 |
| 61-198681 | 9/1986 | Japan | 437/24 |
| 63-299328 | 12/1988 | Japan | 437/24 |
| 1-255220 | 10/1989 | Japan | 437/24 |
| 3-131020 | 6/1991 | Japan | 437/24 |

OTHER PUBLICATIONS

Aronowitz, Sheldon, "Interactions Between Interstitial Atoms in Silicon: Arsenic–Argon–Boron and Boron–Argon–Phosphorus", *J. Appl. Phys.*, vol. 63, No. 4, Feb., 1988, pp. 1037–1040.

Aronowitz, Sheldon, "Quantum–Chemical Modeling of Boron and Noble Gas Dopants in Silicon", *J. Appl. Phys.*, vol. 54, No. 7, Jul., 1983, pp. 3930–3934.

Cullis, A. G., et al., "Comparative Study of Annealed Neon–, Argon–, and Krypton–Ion Implantation Damage in Silicon", *J. Appl. Phys.*, vol. 49, No. 10, Oct., 1978, pp. 5188–5198.

Delfino, M., et al., "Epitaxial Regrowth of Silicon Implanted with Argon and Boron", *Appl. Phys. Lett.*, vol. 44, No. 6, Mar. 15, 1984, pp. 594–596.

Milgram, A., et al., "Effect of Argon Implantation on the Activation of Boron Implanted in Silicon", *Appl Phys. Lett.*, vol. 42, No. 10, May 15, 1983, pp. 878–880.

*Primary Examiner*—Tom Thomas
*Assistant Examiner*—S. Mulpuri
*Attorney, Agent, or Firm*—John P. Taylor

[57] ABSTRACT

A process and resulting product are described for controlling the channeling and/or diffusion of a boron dopant in a P- region forming the lightly doped drain (LDD) region of a PMOS device in a single crystal semiconductor substrate, such as a silicon substrate. The channeling and/or diffusion of the boron dopant is controlled by implanting the region, prior to implantation with a boron dopant, with noble gas ions, such as argon ions, at a dosage at least equal to the subsequent dosage of the implanted boron dopant, but not exceeding an amount equivalent to the implantation of about $3\times10^{13}$ argon ions/cm$^2$ into a silicon substrate, whereby channeling and diffusion of the subsequently implanted boron dopant is inhibited without, however, amorphizing the semiconductor substrate.

16 Claims, 3 Drawing Sheets

IMPLANTING AT LEAST THE PORTION OF A SEMICONDUCTOR SUBSTRATE WHERE A P- LDD REGION OF A PMOS DEVICE WILL BE FORMED WITH A SUBAMORPHOUS DOSE OF ARGON IONS IN AN AMOUNT EQUAL TO OR EXCEEDING A SUBSEQUENT BORON IMPLANT DOSAGE TO THEREBY INHIBIT CHANNELING AND/OR DIFFUSION OF SUCH SUBSEQUENTLY IMPLANTED BORON DOPANT USED TO FORM THE P- LDD REGION

THEN IMPLANTING THAT PORTION OF THE SUBSTRATE WITH A SUFFICIENT DOSAGE OF A BORON DOPANT TO PERMIT SUBSEQUENT FORMATION OF THE P- LDD REGION OF THE PMOS DEVICE

THEN CONVENTIONALLY COMPLETING THE FORMATION OF THE PMOS DEVICE

FIG. 7

IMPLANTATION OF A SEMICONDUCTOR SUBSTRATE WITH CONTROLLED AMOUNT OF NOBLE GAS IONS TO REDUCE CHANNELING AND/OR DIFFUSION OF A BORON DOPANT SUBSEQUENTLY IMPLANTED INTO THE SUBSTRATE TO FORM P- LDD REGION OF A PMOS DEVICE

BACKGROUND OF THE INVENTION

1. Field of the Invention

This invention relates to the formation of integrated circuit devices. More particularly it relates to the reduction of channeling and/or diffusion of a boron dopant in an LDD region of a PMOS device by implantation with noble gas ions of a portion of a semiconductor substrate where the P- LDD region will be subsequently formed.

2. Description of the Related Art

In the formation of integrated circuit structures having ever decreasing dimensions, the tolerance for channeling and/or diffusion of doped regions decreases as the dimensions of the semiconductor devices are reduced. Many MOS devices are formed with lightly doped drain (LDD) regions between the drain region and the channel portion of the MOS device to improve the performance of the MOS device. It is, therefore, of particular interest to be able to control the channeling and or/diffusion of the dopant used to form such LDD regions in a semiconductor substrate.

It is known that the presence of implanted noble gas ions, such as argon ions, in a semiconductor substrate, such as a silicon substrate, can have an effect on conventional dopants (boron, phosphorus, and arsenic) in the substrate used to provide certain types of conductivity (e.g., N or P type regions) in the silicon substrate. is also known that the implantation of a single crystal lattice in a semiconductor substrate, such as a silicon substrate, with sufficient dosages of noble gas ions such as argon ions, can have a disruptive effect on the crystal lattice of the substrate. Cullis et al., in "Comparative Study of Annealed Neon-, Argon-, and Krypton-Ion Implantation Damage in Silicon", published in the Journal of Applied Physics 49(10) in October 1978, at pages 5188–5198, reported that silicon layers bombarded with high doses ($8 \times 10^{14}$ atoms/cm$^2$) of argon ions at 100 keV followed by annealing at 1000° C. gave complex dislocation entanglements, together with other lattice defects, and stated that the implantation of Ar$^+$ions into silicon is known to result in a lattice disorder which is particularly hard to remove by annealing.

Milgram et al. in "Effect of Argon Implantation on the Activation of Boron Implanted in Silicon", published in Applied Physics Letters 42(10) in May of 1983, at pages 878–880 reports that both the electrical activation and diffusion of boron implanted in silicon was inhibited by the prior or subsequent implantation of the boron-doped region of the substrate with argon at a dosage of $1.0 \times 10^{15}$ argon ions/cm$^2$, a dosage level said to be sufficient to produce an amorphous layer.

Delfino et al. in "Epitaxial Regrowth of Silicon Implanted with Argon and Boron", published in Applied Physics Letters 44(6) in March, 1984, at pages 594–596, report that a silicon substrate implanted with a $1.0 \times 10^{15}$ ions/cm$^2$ dosage of argon and a $1.0 \times 10^{14}$ ions/cm$^2$ dosage of boron can be subsequently annealed at 900° C. and further indicate that the combined presence of the boron and argon atoms in the lattice appears to enhance the annealing rate without redistribution of the boron dopant.

Aronowitz, in "Quantum-Chemical Modeling of Boron and Noble Gas Dopants in Silicon", published in the Journal of Applied Physics 54(7) in July, 1983, at pages 3930–3934, observed that when argon and boron were implanted together, both the diffusion and the electrical activation of boron are found to be retarded in the presence of argon, irrespective of whether or not the argon was implanted before or after the boron, and indicates that such results imply that the defects created by the implanted argon may act as centers to attract the boron, or that the argon itself might act to attract the boron.

Aronowitz U.S. Pat. No. 4,689,667 describes the controlling of dopant diffusion and dopant electrical activation by the implantation of noble gas atoms such as argon, implanted at a dosage of $1 \times 10^{15}$ argon ions/cm$^2$, and shows that the combination of argon and a second dopant can have an interactive effect to control the electrical activation and attenuate the spatial distribution of a first dopant atom.

Aronowitz, in "Interactions Between Interstitial Atoms in Silicon: Arsenic-Argon-Boron and Boron-Argon-Phosphorus", published in the Journal of Applied Physics 63(4) in February, 1988, at pages 1037–1040, states that it is known that regions in silicon with overlapping populations of implanted arsenic and argon display reduced arsenic diffusion and diminished electrical activity. This is said to have been used by others as a mechanism to reduce electrical fields in the vicinity of the drain in a short-channel MOS device. The author goes on to state that when argon and boron are implanted at energies such that their peak concentrations collide, then both reduced boron electrical activity and mutually retarded argon and boron diffusion patterns are observed.

Thus, the interaction of implanted noble gas ions and implanted dopants in single crystal semiconductor substrates is well known, including the damage which occurs to a silicon substrate, the retardation of diffusion of dopant atoms in a semiconductor substrate in the presence of the noble gas atoms such as argon, and the negative effect on electrical activation of the dopant, although the semiconductor substrate damage appears to be repairable upon subsequent annealing, and the effect of the noble gas ions such as argon ions on subsequent electrical activation seems to be less with boron than with N-type dopants.

However, it would be desirable to control both the diffusion and channeling of a dopant in a semiconductor substrate, such as a single crystal silicon substrate, without disrupting (amorphizing) the single crystal structure of the substrate.

SUMMARY OF THE INVENTION

In accordance with the invention, the channeling and/or diffusion of a boron dopant in a P- region forming the lightly doped drain (LDD) region of a PMOS device in a single crystal semiconductor substrate can be controlled by implanting at least this region of the semiconductor substrate, prior to the boron implantation, with noble gas ions at a dosage at least equal to the subsequent dosage of implanted boron atoms, but not exceeding a dosage amount equivalent to the implantation of a silicon substrate with about $3 \times 10^{14}$ argon ions/cm$^2$, whereby channeling and/or diffusion of the subsequently implanted boron dopant is inhibited without, however, amorphizing the semiconductor substrate.

BRIEF DESCRIPTION OF THE DRAWINGS

FIG. 7 is a flowsheet illustrating the process of the invention.

DETAILED DESCRIPTION OF THE INVENTION

The invention is a process which results in the inhibiting of channeling and/or diffusion of a boron dopant in a P- region forming the lightly doped drain (LDD) region of a PMOS device in a single crystal semiconductor substrate, and the product of this process. The process comprises implanting at least this region of the semiconductor substrate, prior to the boron implantation, with noble gas ions at a dosage at least equal to the subsequent dosage of implanted boron atoms, but not exceeding an amount equivalent to the implantation of about $3\times10^{14}$ argon ions/cm$^2$ in a silicon semiconductor substrate, whereby channeling and/or diffusion of the subsequently implanted boron dopant to form the P- region is inhibited without, however, amorphizing the semiconductor substrate.

Figure 1:
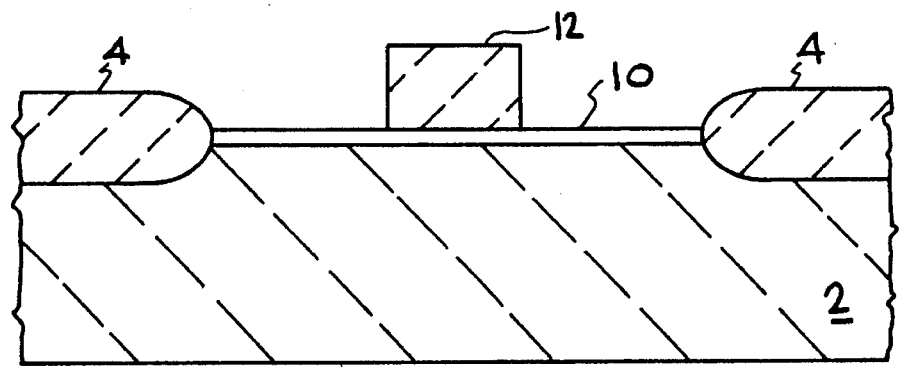
FIG. 1 is a fragmentary vertical cross-sectional view of a portion of a silicon substrate where a PMOS device is being constructed, with the gate electrode already formed.

Referring now to FIG. 1, a fragment of a semiconductor substrate, such as a silicon substrate, is shown at 2. Substrate 2 may comprise a N type semiconductor material or an N-well formed in a P type semiconductor material, e.g., by implanting a P type silicon substrate with about $7-9\times10^{12}$ phosphorus ions/cm$^2$. The semiconductor substrate may comprise either silicon or germanium, although the use of silicon is, at present, preferred. Therefore, by way of illustration, and not of limitation, semiconductor substrate 2 will hereinafter be referred to as either silicon substrate 2 or substrate 2.

Substrate 2 is shown with field oxide isolation portions 4 already grown in the surface of substrate 2 to define an area of substrate 2 therebetween in which a PMOS device will be constructed in substrate 2. Other forms of isolation, such as insulation-filled trenches, could be used instead of field oxide portions 4 to define the area of substrate 2 where the PMOS device will be formed.

A thin oxide layer 10 (sometimes referred to as a gate oxide layer) is shown formed over the area of substrate 2 bounded by field oxide portions 4 or equivalent isolation techniques. A gate electrode 12, formed from a conductive material such as doped polysilicon, is shown formed over a portion of thin oxide layer 10, leaving the remaining area of substrate 2 bounded by field oxide 4 covered only by thin oxide layer 10.

Figure 2:
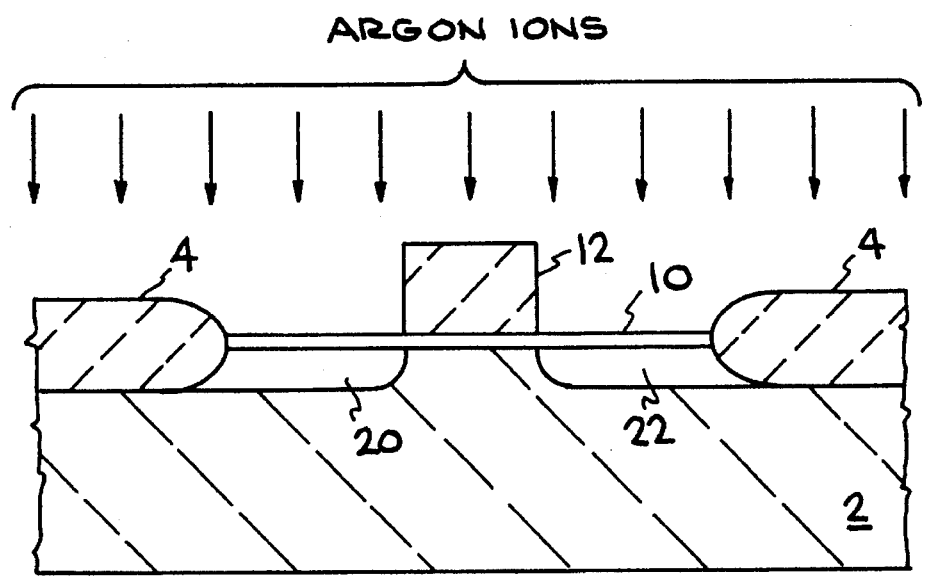
FIG. 2 is a fragmentary vertical cross-sectional view of the silicon substrate portion of FIG. 1 after implantation with argon ions.

As shown in FIG. 2, this area of substrate 2 bounded by field oxide 4 and covered only by thin oxide layer 10 is now implanted with a subamorphous dose of noble gas ions, such as argon ions, forming, e.g., argon-implanted regions 20 and 22 in substrate 2. Other noble gases, including krypton, neon, and xenon may be used instead of argon to implant substrate 2. However, by way of illustration, and not of limitation, the implanted gas ions will hereinafter be referred to as argon ions.

The maximum dosage of the noble gas implant should be an amount insufficient to amorphize the semiconductor substrate lattice. For the implantation of a silicon lattice with argon ions, the dosage amount should not exceed $3\times10^{14}$ argon ions/cm$^2$. The maximum dosage amount of the noble gas implant will, however, vary with both the noble gas and the semiconductor substrate. The maximum dosage of the noble gas ions will, therefore, be referred to as an amount equivalent to $3\times10^{14}$ argon ions/cm$^2$ implanted into a silicon substrate.

The minimum dosage of the noble gas atoms will comprise an amount at least equal to the dosage of boron implanted into the semiconductor substrate to avoid the presence of an amount of implanted boron dopant in excess of the noble gas ion concentration in the P- portion of the semiconductor substrate.

The energy level used to implant the noble gas ions such as argon into substrate 2 will vary with the desired depth of the implant, i.e., the depth of the desired LDD region to be subsequently formed in substrate 2. Usually the energy, expressed as an amount equivalent to an amount needed for the implantation of argon atoms into silicon, will vary from about 40 keV to about 100 keV, and preferably will range from about 50 keV to about 90 keV.

Figure 3:
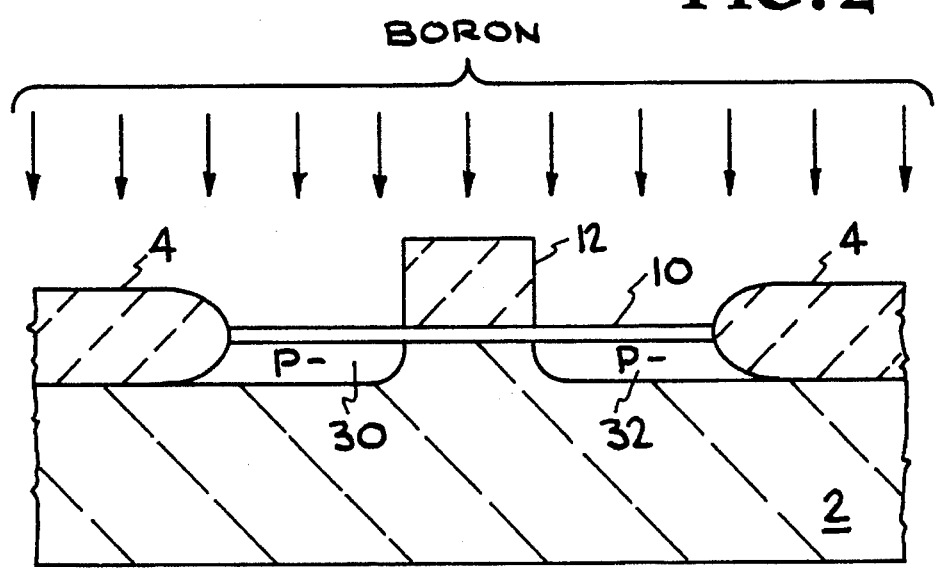
FIG. 3 is a fragmentary vertical cross-sectional view of the silicon substrate portion of FIG. 2 after a boron implantation to form the P- LDD regions.

Following the noble gas ion implantation into substrate 2 to form regions 20 and 22 in substrate 2, a boron dopant is implanted into noble gas-implanted regions 20 and 22 to form P- boron-doped regions 30 and 32 in substrate 2, as shown in FIG. 3. It should be noted that while the prior art references disclose noble gas ion implantations carried out either before or after implantation of the substrate with boron, it is important to the practice of this invention that the noble gas ions be implanted before implanting the boron dopant to thereby impede channeling by the ions of the boron dopant in the substrate. While the prior art implanted noble gas ions such as argon at dosages high enough to amorphize the crystal lattice of the silicon substrate, the practice of this invention involves implantation of noble gas ions at subamorphizing dosages, in which case, subsequent annealing will not result in concentrating the boron dopant at the interface of previously amorphized structures where the boron dopant would tend to diffuse and concentrate.

The minimum dosage amount of the boron dopant implant into the semiconductor substrate to form the P- regions should be equivalent to at least about $1\times10^{12}$ boron ions/cm$^2$ The maximum amount should, however, not exceed the dosage of the previously implanted noble gas ions into the same region. When the substrate comprises silicon and the implanted noble gas ions are argon ions, the boron equivalent dosage should not exceed about $3\times10^{14}$ boron ions/cm$^2$. It should be noted that the boron dopant implant may comprise atomic boron or a boron-containing compound such as $BF_2$, and therefore the concentration of the boron dopant is expressed in terms of amounts equivalent to doping with atomic boron. References herein to "boron dopant" implantations should, therefore, be deemed to include boron from any source of boron, including any boron compounds, conventionally used in the implantation of boron into a semiconductor substrate.

The implantation energy for the boron implant should be adjusted, relative to the implantation energy used in the noble gas ion implantation step, so that the same region (volume) implanted with noble gas ions is also implanted with the boron dopant. For example, when a silicon substrate is implanted with argon ions at an energy level of 40 keV, the implantation energy level of the boron implant should be about 60 keV for $BF_2$ (mass 49), or about 10 keV for atomic boron (mass 11).

Figure 4:
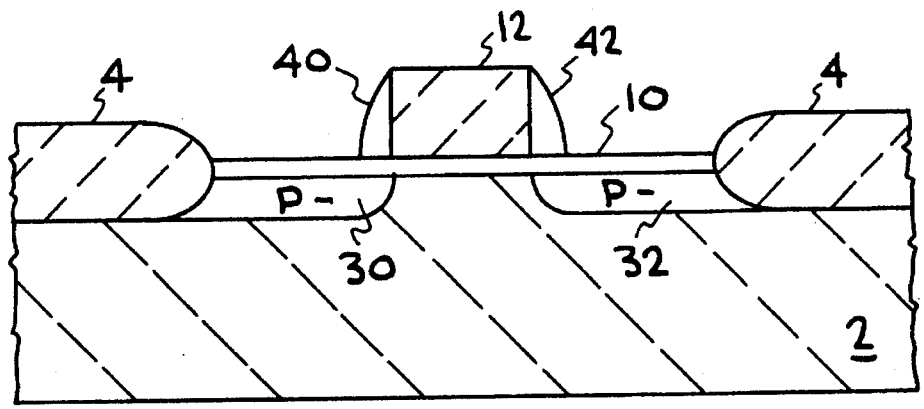
FIG. 4 is a fragmentary vertical cross-sectional view of the silicon substrate portion of FIG. 3 after the formation of oxide spacers on the sidewall of the gate electrode over the LDD regions to permit P doping with boron of the remaining portion of the silicon substrate not covered by the oxide spacers to form the source and drain regions of the PMOS device.
Figure 5:
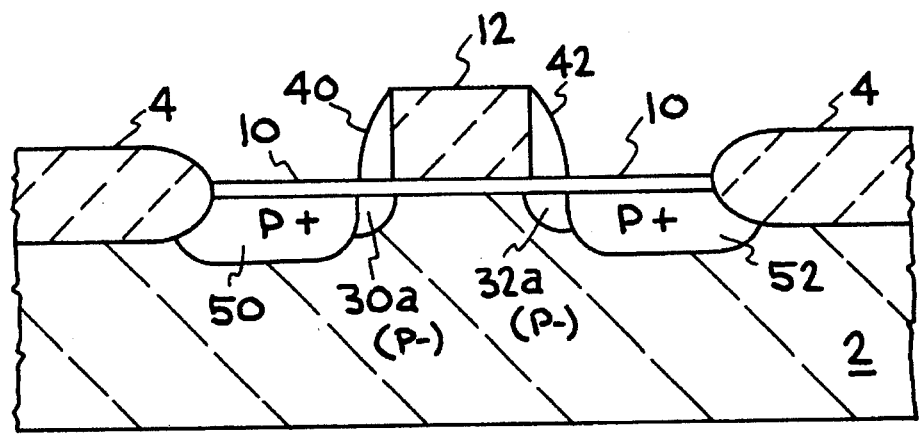
FIG. 5 is a fragmentary vertical cross-sectional view of the silicon substrate portion of FIG. 4 after conventional boron doping of the portion of the silicon substrate not covered by the oxide spacers to form the P doped source and drain regions of the PMOS device.

Following the formation of boron-doped P- regions 30 and 32 in substrate 2, as shown in FIGS. 4 and 5, the structure is subjected to conventional processing to form the source and drain regions of the PMOS device. That is, a layer of oxide (not shown) may be formed over the structure and then anisotropically etched, e.g., subject to a reactive ion etch (RIE) to remove the oxide layer, leaving oxide spacers 40 and 42 on the sidewalls of polysilicon gate electrode 12 to act as masks over what will be the LDD regions of the PMOS device. The structure is then subject to a conventional boron implant to form P type source and drain regions 50 and 52 in substrate 2, as shown in FIG. 5, leaving LDD regions 30a and 32a to be formed respectively under oxide spacer masks 40 and 42.

The structure may then be subjected to an anneal at a temperature of about 900° C. for a period of about minutes, e.g., in a furnace, to activate the boron implanted in substrate 2 to form LDD regions 30a and 32a, as well as conventionally formed source/drain regions 50 and 52. Other methods for activation of the dopant and recrystallization may be employed, e.g., such as rapid thermal annealing (RTA).

Figure 6:
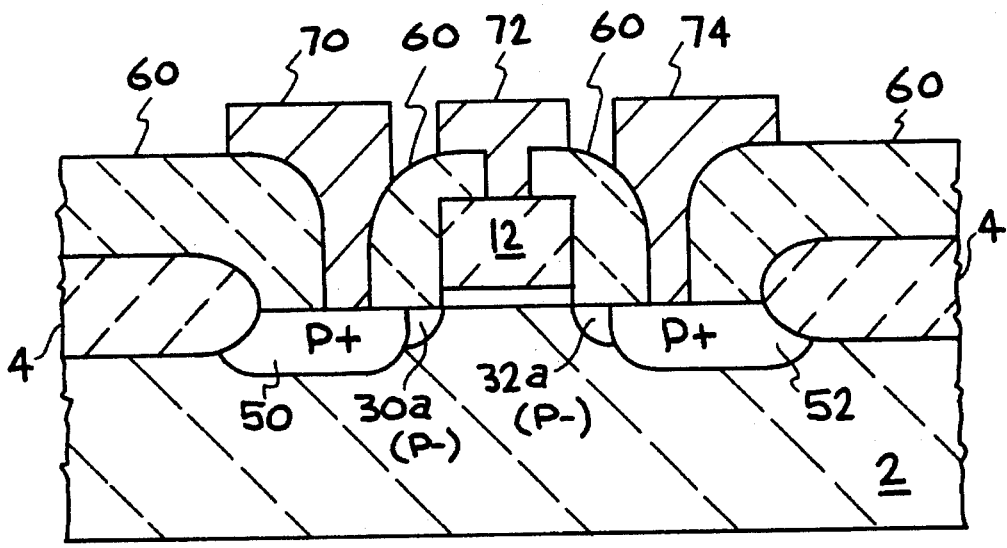
FIG. 6 is a vertical cross-sectional view of the finished PMOS device incorporating the LDD regions formed in accordance with the invention.

Subsequent steps to finish the formation of the desired PMOS device, i.e., formation of one or more insulation layers, contact openings through such insulation to the source, drain, and gate electrode, and formation of contacts, etc. are conventional, as shown, for example, in the finished device illustrated in FIG. 6, wherein an oxide layer 60 is formed over the structure and contact openings are formed in oxide layer 60 which are then filled by a metal layer which is then patterned to form source contact 70, gate contact 72, and drain contact 74.

To illustrate the inhibition of channeling and/or diffusion of the implanted boron dopant from the LDD region of a semiconductor substrate previously implanted with noble gas ions, silicon wafers, each having an N well initially formed by doping the substrate with phosphorus at a dosage of $7 \times 10^{12}$ phosphorus ions/cm$^2$, may be implanted with argon ions at a dosage of $3 \times 10^{14}$ argon ions/cm$^2$ at an implant energy of about 40 keV. Each of the argon-implanted wafers, as well as several control wafers not implanted with argon ions, may then be implanted with a boron dopant, using $BF_2$, at a dosage of $1.5 \times 10^{13}$ $BF_2$ ions/cm$^2$ at an energy level of 60 keV. The wafers may then be annealed at 850° C. for 30 minutes. The diffusion and channeling of the boron dopant for each wafer may then be determined using an active carrier distribution measurement technique known as Spreading Resistance Profile. The channeling and diffusion of the boron dopant will be found to be considerably less for the wafers previously implanted with the argon ions.

To further illustrate the overall performance of PMOS devices constructed in accordance with the invention, a number of PMOS devices were constructed in N wells of p type silicon semiconductor wafers, wherein the N well was initially formed by doping the substrate with phosphorus at a dosage of either $7 \times 10^{12}$ phosphorus ions/cm$^2$ or $9 \times 10^{12}$ phosphorus ions/cm$^2$. The wafers were implanted with argon ions at a dosage of $3 \times 10^{14}$ argon ions/cm$^2$ at respective implant energies of either 70 keV or 90 keV. The $BF_2$ dosage for the subsequent boron dopant implant to form the P- LDD regions of each of the PMOS devices, including the control wafers, was $1.5 \times 10^{23}$ $BF_2$ ions/cm$^2$. The PMOS devices were constructed with various channel lengths as noted. The remainder of the formation of the PMOS devices was conventional. Table I shows the saturation voltages for various channel lengths of argon-implanted PMOS devices as well as for controls having no argon implant. It will be seen that the saturated voltages are more negative (greater in magnitude) for all channel lengths when argon is present than when the wafers are not implanted with argon. Table II shows the saturation current for the same channel lengths as in Table I. It will be noted that these values are reduced in magnitude when argon has been implanted than when argon is not present. Such results are consistent with the higher (in magnitude) voltage saturation values when argon has been implanted. Table III shows the leakage current for the various channel lengths. When argon is present, the leakage current is not adversely impacted. Table IV shows the breakdown voltage for the PMOS structures at various channel lengths. It will be noted that the breakdown voltage is significantly higher (in magnitude) when argon is present for nominal channel lengths of 0.4 micrometers (μm) or smaller.

TABLE I

| Wafer No. | N-Well Implant (E12) | Argon Implant Energy | Saturation Voltage (Volts) for Various Channel Lengths (in μm) | | | |
|---|---|---|---|---|---|---|
| | | | 0.5 | 0.4 | 0.35 | 0.3 |
| 1 | 7 | Control | −0.923 | −0.895 | −0.857 | −0.740 |
| 2 | 7 | 70 keV | −0.949 | −0.939 | −0.908 | −0.852 |
| 3 | 7 | 70 keV | −0.949 | −0.935 | −0.911 | −0.841 |
| 4 | 7 | 90 keV | −0.956 | −0.942 | −0.917 | −0.859 |
| 5 | 7 | 90 keV | −0.956 | −0.940 | −0.915 | −0.844 |
| 6 | 9 | Control | −0.834 | −0.788 | −0.724 | −0.440 |
| 7 | 9 | Control | −0.833 | −0.789 | −0.722 | −0.335 |
| 8 | 9 | 70 keV | −0.892 | −0.867 | −0.837 | −0.747 |
| 9 | 9 | 70 keV | −0.892 | −0.867 | −0.829 | −0.719 |
| 10 | 9 | 90 keV | −0.891 | −0.871 | −0.836 | −0.748 |
| 11 | 9 | 90 keV | −0.894 | −0.872 | −0.825 | −0.690 |

TABLE II

| Wafer No. | N-Well Implant (E12) | Argon Implant Energy | Saturation Current (mAmps) for Various Channel Lengths (in μm) | | | |
|---|---|---|---|---|---|---|
| | | | 0.5 | 0.4 | 0.35 | 0.3 |
| 1 | 7 | Control | −0.337 | −0.394 | −0.439 | −0.520 |
| 2 | 7 | 70 keV | −0.310 | −0.359 | −0.389 | −0.486 |
| 3 | 7 | 70 keV | −0.314 | −0.365 | −0.400 | −0.460 |
| 4 | 7 | 90 keV | −0.312 | −0.357 | −0.397 | −0.453 |
| 5 | 7 | 90 keV | −0.322 | −0.371 | −0.409 | −0.472 |
| 6 | 9 | Control | −0.368 | −0.434 | −0.483 | −0.574 |
| 7 | 9 | Control | −0.378 | −0.448 | −0.497 | −0.605 |
| 8 | 9 | 70 keV | −0.316 | −0.364 | −0.404 | −0.465 |
| 9 | 9 | 70 keV | −0.325 | −0.381 | −0.424 | −0.488 |
| 10 | 9 | 90 keV | −0.322 | −0.374 | −0.411 | −0.478 |
| 11 | 9 | 90 keV | −0.335 | −0.392 | −0.434 | −0.509 |

TABLE III

| Wafer No. | N-Well Implant (E12) | Argon Implant Energy | Leakage Current ($10^{-12}$ Amps) for Various Channel Lengths (in μm) | | | |
|---|---|---|---|---|---|---|
| | | | 0.5 | 0.4 | 0.35 | 0.3 |
| 1 | 7 | Control | −2.00 | −3.00 | −3.00 | −3.24 |
| 2 | 7 | 70 keV | −2.00 | −3.00 | −2.00 | −1.30 |
| 3 | 7 | 70 keV | −2.00 | −3.00 | −3.00 | −1.10 |
| 4 | 7 | 90 keV | −2.00 | −3.00 | −3.00 | −6.00 |
| 5 | 7 | 90 keV | −2.00 | −3.00 | −3.00 | −6.10 |
| 6 | 9 | Control | −2.00 | −3.00 | −1.50 | −1.45 |
| 7 | 9 | Control | −2.00 | −3.00 | −1.70 | −5.75 |
| 8 | 9 | 70 keV | −2.00 | −3.00 | −3.00 | −5.00 |
| 9 | 9 | 70 keV | −2.00 | −3.00 | −3.00 | −2.86 |
| 10 | 9 | 90 keV | −2.00 | −3.00 | −3.00 | −3.70 |
| 11 | 9 | 90 keV | −2.00 | −3.00 | −3.00 | −1.08 |

TABLE IV

| Wafer No. | N-Well Implant (E12) | Argon Implant Energy | Breakdown Voltage (Volts) for Various Channel Lengths (in μm) | | | |
|---|---|---|---|---|---|---|
| | | | 0.5 | 0.4 | 0.35 | 0.3 |
| 1 | 7 | Control | −9.55 | −9.45 | −6.69 | −4.03 |
| 2 | 7 | 70 keV | −9.56 | −9.51 | −8.20 | −5.39 |
| 3 | 7 | 70 keV | −9.50 | −9.43 | −7.57 | −4.79 |
| 4 | 7 | 90 keV | −9.44 | −9.40 | −8.60 | −5.75 |
| 5 | 7 | 90 keV | −9.31 | −9.29 | −7.71 | −5.00 |
| 6 | 9 | Control | −9.59 | −9.02 | −6.02 | −3.26 |
| 7 | 9 | Control | −9.56 | −8.89 | −6.02 | −2.92 |
| 8 | 9 | 70 keV | −9.59 | −9.58 | −8.55 | −5.34 |
| 9 | 9 | 70 keV | −9.54 | −9.50 | −7.87 | −4.76 |
| 10 | 9 | 90 keV | −9.46 | −9.46 | −8.83 | −5.52 |
| 11 | 9 | 90 keV | −9.38 | −9.34 | −7.76 | −4.47 |

Thus, the invention provides for the inhibition of channeling and/or diffusion of boron dopant from LDD regions (or concentrating the boron dopant in any particular portion of the LDD regions) in PMOS devices by the implantation of noble gas ions into the semiconductor substrate without amorphizing the substrate and without reducing the saturation voltage, or increasing the leakage current, or lowering the breakdown voltage of the resulting PMOS device. The result is an improved process for forming PMOS devices containing LDD regions, and an improved PMOS device, resulting in an improved integrated circuit structure.

Such an improved integrated structure constructed in accordance with the invention may find utility in any electrical/electronic system using "IC's" or integrated circuit substrates. Thus, the structure and process of the present invention may be utilized in system level products comprising single chip modules (SCM) often including other electrical components (such as capacitors, resistors, inductors, etc.); multi-chip modules (MCM) having at least two integrated circuit die in the same or separate packages, with or without other electrical components; board level products (BLP) such as those having multiple integrated circuits on printed wiring board(s) (PWB); and box level products (Boxes) which may include a combination of elements from the list of SCM, MCM, BLP, and the like. One or more of such SCM, MCM, PWB, or BLP's may act as, or be integrated into a functional system or subsystem. The system level products contemplated include digital data storage; security and surveillance systems, general purpose computers (such as personal computers, work stations, servers, mini computers, mainframe computers and super computers); digital audio and video compression and transmission; transportation vehicles (such as airplanes, trains, automobiles, helicopters, rockets, missiles, boats, submarines, and the like); subsystems utilized in such vehicles (such as navigational positioning, i.e., Global Positioning System (GPS), navigational displays and controllers, hazard avoidance such as radar and sonar, fly by wire control, and digital engine control and monitoring); entertainment systems (such as digital television and radio, digital cameras, audio and video recorders, compact disc players, digital tape, or the like); and communications (such as PBX, telephone switching, voice mail, auto attendant, network controllers, video teleconferencing, digital data transmission (such as token ring, ethernet, ATM, or the like)); and subsystems or subassemblies for inclusion or attachment to more complex system level products.

Having thus described the invention what is claimed is:

1. A process for controlling channeling and/or diffusion of a boron dopant in a P- LDD region of a PMOS integrated circuit device formed in a semiconductor substrate which comprises the steps of:

a) implanting with noble gas ions, at a dosage level not exceeding an amount equivalent to the implantation of about $3\times10^{14}$ argon ions/cm$^2$ into a silicon substrate, an N doped portion of said semiconductor substrate where P type source and drain regions will be formed; and b) then implanting with a boron dopant said N doped portion of said semiconductor substrate previously implanted with said noble gas ions, said boron dopant implantation dosage comprising an amount sufficient to form said P- LDD region, but not exceeding said noble gas ion dosage;

whereby channeling and/or diffusion of said implanted boron dopant to form said P- LDD region will be inhibited without, however, amorphizing said semiconductor substrate.

2. The process of claim 1 wherein said step of implanting said semiconductor substrate with noble gas ions further comprises implanting said noble gas ions at a dosage level at least equal to the dosage level of the subsequent implantation with boron dopant to form said P- LDD region.

3. The process of claim 1 wherein said step of doping said noble gas ion-implanted substrate with a boron dopant to form said LDD region further comprises implanting said substrate with a boron dopant at a dosage equivalent to at least about $1\times10^{12}$ boron ions/cm$^2$.

4. The process of claim 1 wherein said step of implanting said semiconductor substrate with noble gas ions further comprises implanting said semiconductor substrate with noble gas ion selected from the group consisting of neon, argon, krypton, and xenon.

5. The process of claim 4 wherein said step of doping said noble gas ion-implanted substrate with a boron dopant to form said LDD region further comprises implanting said substrate with a boron dopant at a dosage equivalent to at least about $1\times10^{12}$ boron ions/cm$^2$, but not exceeding about $3\times10^{14}$ boron ions/cm$^2$.

6. The process of claim 4 wherein said step of implanting said semiconductor substrate with noble gas ions further comprises implanting said semiconductor substrate with neon ions.

7. The process of claim 4 wherein said step of implanting said semiconductor substrate with noble gas ions further comprises implanting said semiconductor substrate with argon ions.

8. The process of claim 4 wherein said step of implanting said semiconductor substrate with noble gas ions further comprises implanting said semiconductor substrate with krypton ions.

9. The process of claim 4 wherein said step of implanting said semiconductor substrate with noble gas ions further comprises implanting said semiconductor substrate with xenon ions.

10. The process of claim 1 wherein step of implanting said semiconductor substrate with noble gas ions further comprises implanting said semiconductor substrate with argon ions, and said step of doping said noble gas ion-implanted substrate with a boron dopant to form said LDD region further comprises implanting said substrate with a boron dopant at a dosage equivalent to at least about $1 \times 10^{12}$ boron ions/cm$^2$.

11. The process of claim 1 including the further step of forming an N well in said semiconductor substrate prior to said noble gas ion implantation step, whereby said N doped portion of said substrate implanted with said noble gas ions is located in said N well.

12. The process of claim 11 including the further step of forming a gate electrode over a portion of the surface of said N well in said substrate prior to said noble gas ion implantation step.

13. The process of claim 12 including the further step of forming a sidewall spacer on the sidewall of said gate electrode over said LDD region after said step of doping said substrate with boron to form said LDD region and prior to forming source and drain regions in said substrate.

14. A process for controlling channeling and/or diffusion of boron in a P- LDD region of a PMOS integrated circuit device formed in a silicon substrate which comprises the steps of:
   a) implanting with argon ions, at a dosage level not exceeding about $3 \times 10^{14}$ argon ions/cm$^2$, an N doped portion of said silicon substrate where P type source and drain regions will be formed; and
   b) then implanting with a boron dopant said N doped portion of said silicon substrate previously implanted with said argon ions, said boron dopant implantation dosage comprising an amount sufficient to form said P- LDD region, but not exceeding said argon ion dosage; whereby channeling and/or diffusion of said implanted boron dopant to form said P- LDD region will be inhibited without, however, amorphizing said semiconductor substrate.

15. The process of claim 14 wherein said step of doping said argon ion-implanted silicon substrate with a boron dopant to form said LDD region further comprises implanting said silicon substrate with a dosage of a boron dopant equivalent to at least about $1 \times 10^{12}$ boron ions/cm$^2$, but not exceeding about $3 \times 10^{14}$ boron ions/cm$^2$.

16. A process for controlling channeling and/or diffusion of a boron dopant in a P- LDD region of a PMOS integrated circuit device formed in a semiconductor substrate which comprises the steps of:
   a) implanting an N doped portion of said semiconductor substrate where P type source and drain regions will be formed, with noble gas ions, at a dosage level not exceeding an amount equivalent to the implantation of about $3 \times 10^{14}$ argon ions/cm$^2$ into a silicon substrate, whereby channeling and/or diffusion of the subsequently implanted boron dopant to form the P-LDD region will be inhibited without, however, amorphizing the semiconductor substrate; and
   b) then implanting with a boron dopant said N doped portion of said semiconductor substrate previously implanted with said noble gas ions, said boron dopant implantation dosage comprising an amount equivalent to at least about $1 \times 10^{12}$ boron ions/cm$^2$, but not exceeding said noble gas ion dosage.

* * * * *

UNITED STATES PATENT AND TRADEMARK OFFICE
CERTIFICATE OF CORRECTION

PATENT NO. : 5,585,286
DATED : December 17, 1996
INVENTOR(S) : Sheldon Aronowitz, James Kimball, Yu-Lam Ho, Gobi Padmanabhan, Douglas T. Grider, and Chi-Yi Kao It is certified that error appears in the above-indentified patent and that said Letters Patent is hereby corrected as shown below:

Title Page:

Item [57], ABSTRACT, line 7, change "dopant,," to "dopant,".

Item [57], ABSTRACT, line 11, change "$3x10^{13}$" to "$3x10^{14}$".

Col. 8, line 48, claim 4, change "ion" to "ions".

Col. 9, line 5, claim 10, after "wherein", insert "said".

Col. 10, line 26, claim 16, change "P-LDD" to "P- LDD".

Signed and Sealed this

Twenty-ninth Day of April, 1997

Attest:

BRUCE LEHMAN

*Attesting Officer*  *Commissioner of Patents and Trademarks*